United States Patent [19]

Ravindhran et al.

[11] Patent Number: 5,395,773
[45] Date of Patent: Mar. 7, 1995

[54] MOSFET WITH GATE-PENETRATING HALO IMPLANT

[75] Inventors: K. S. Ravindhran, San Antonio; Yu P. Han, Dallas; Ravi Jhota; Walter D. Parmantie, both of San Antonio, all of Tex.

[73] Assignee: VLSI Technology, Inc., San Jose, Calif.

[21] Appl. No.: 221,338

[22] Filed: Mar. 31, 1994

[51] Int. Cl.⁶ .......................................... G01N 33/24
[52] U.S. Cl. ..................................... 437/27; 437/29; 437/41
[58] Field of Search ............................ 437/27, 29, 45

[56] References Cited

U.S. PATENT DOCUMENTS 4,306,916 12/1981 Wallesen .................... 437/27
4,968,639 11/1990 Bergonzoni ................ 437/27

OTHER PUBLICATIONS

S. Rathnam et al., "An optimized 0.5 micron LDD Transistor", IEDM, 1983, p. 237.

Primary Examiner—Brian E. Hearn
Assistant Examiner—Michael W. Russell
Attorney, Agent, or Firm—Clifton L. Anderson

[57] ABSTRACT

After gates are patterned in a submicron CMOS process, a halo implant is performed with sufficient energy that the halo implant penetrates the gate structures to below the transistor channel regions. Where the substrate is not masked by gate materal, the halo implant penetrates below drain and source regions. During diffusion, this halo limits lateral diffusion of the source/drain dopants. The resulting transistor exhibits enhanced breakdown voltage characteristics during both on and off conditions.

5 Claims, 4 Drawing Sheets

MOSFET WITH GATE-PENETRATING HALO IMPLANT

BACKGROUND OF THE INVENTION

The present invention relates to semiconductor processing and, more particularly, to a method for the manufacture of field-effect transistors. A major objective of the present invention is provide for improved submicron field-effect transistors.

Modern technological progress has resulted from the increasing miniaturization of integrated circuit elements made possible by advances in semiconductor processing technology. One of the most important circuit elements made possible by semiconductor processing is the IGFET (Insulated-Gate field-effect transistor). IGFETS are more popularly known as "MOS" transistors or "MOSFETs" (Metal-Oxide-Silicon Field-Effect Transistors). MOS is an acronym for "Metal-Oxide-Silicon". Early MOS devices used metal gates. While polysilicon is currently the gate material of choice today, "MOS" is a well-entrenched misnomer.

AMOS transistor typically functions as a voltage-controlled current switch. The basic components of the MOS transistor are: a source that serves as a current input; a drain that serves as a current output; a channel that selectively couples the source and drain; and a gate that controls the conductivity of the channel. When a forward voltage bias is applied between the source and the drain, the current from the source through the channel to the drain is controlled by the gate voltage.

Most of the early MOS transistors were n-channel devices fabricated using p-type substrates; subsequently, p-channel devices fabricated using N-type substrates predominated. ("n" stands for "negative" and "p" for positive. Of increasing importance is CMOS technology ("C" for "complementary"), that utilizes both n-channel devices and p-channel devices to produce devices with high-speed and lower power consumption.

PMOS processing typically begins with a crystalline silicon substrate that is lightly doped n-type. The n-type dopant is typically phosphorous or arsenic. A dopant is n-type if the majority of charge carriers in the doped silicon are negatively charged electrons. A dopant is p-type if the majority of charge carriers in the doped silicon are positively charged electron holes. A gate oxide is grown over the substrate. Gate material (metal or polysilicon) is deposited over the gate oxide. The polysilicon and the gate oxide are photolithographically patterned to form the gate. P-type dopant is introduced outside the gate to define the source and the drain; the gate masks the channel region directly below, so the channel remains n-type. NMOS technology is similar except that the conductivity types are reversed.

CMOS technology typically begins with an n-type substrate. P-type wells are defined for the p-channel devices. Generally, additional doping is used to define n-wells for the n-channel devices. A boron implant is applied to both the n-wells and the p-wells to establish a suitable voltage threshold for the channels. The gate oxides, the gates, the sources and the drains for both types of transistors can be formed as in NMOS and PMOS technologies.

One of the obstacles to progress in MOS technology is the tendency for the breakdown voltage to fall with decreasing transistor size. The drain-to-source breakdown voltage $BV_{dss}$ is the reverse-bias voltage at which current can be made to flow from drain to source when the gate is off. This current condition signifies an unintended performance of the transistor. Accordingly, a relatively high breakdown voltage is desired for device protection. It is desirable to maintain a breakdown voltage at least twice the normal operating voltage. Thus, for a typical five-volt system, the transistors should have breakdown voltages of 10 volts or more.

As a first approximation, the breakdown voltage can be considered a function of the length and depletion width. A long channel provides a high breakdown voltage. The relative importance of the length depends on the magnitudes, with the lesser magnitude dimension having a more substantial impact on the breakdown voltage.

At large geometries, the channel length is substantially equal to the feature size. Thus, for a 2–3 micron ($\mu$m) technology, the channel length is 2–3 microns. The depletion width is determined by the dopant concentration in and under the channel. This concentration is usually determined by the system requirement that the turn-on voltage for the transistor be nominally 0.7 volts. The depletion width under these circumstances is usually about 1 $\mu$m or less. It turns out that breakdown voltages of 15 volts are readily achieved with these channel dimensions.

Higher breakdown voltages can be achieved using a "punch-through" implant which increases the concentration of channel type dopant below the channel (where breakdown typically occurs). The phrase "punch through" is essential equivalent to "breakdown", as in "breakdown voltage". The punch-through implant is performed before the gate is formed. Channel-type dopant is implanted to a depth below the channel so that the channel dopant concentration is not substantially affected. The increased background concentration effectively reduces the depletion width, increasing the breakdown voltage. For 2–3 $\mu$m devices, breakdown voltages of 25 volts or more can be achieved. This is useful, for example, for input/output transistors.

With advances in semiconductor processing technology, feature sizes, and thus channel length have dropped well below 1 $\mu$m. To maintain 0.7 volt turn on, channel concentrations have increased, decreasing depletion width. However, reductions in depletion width have not kept pace with reductions in channel length, so channel length is a significant consideration for breakdown voltages at 0.8 $\mu$m technology and below.

Accordingly, any loss of channel length for a given feature size can be costly in terms of reduce breakdown voltage. A reduction in channel length can occur due to lateral diffusion of the source and drain dopant. As feature size is decreased, it becomes increasingly important to limit this lateral diffusion of the source/drain dopant.

A halo implant, also called a "pocket implant", has been used to limit lateral diffusion of the source and drain dopant. The halo implant is of the conductivity type opposite that of the source and drain. Like the source/drain implant, it is performed after the gate is defined and before the source/drain diffusion. Due to the masking effect, the halo implant peak concentration is near the source/drain regions. Away from the source/drain edge, the depth of the peak halo concentration falls quickly. The halo implant energy is set so that the peak concentration depth away from the peak is greater than the depth of the source/drain implant so that the vertical source drain diffusion is not impeded. However, the relatively vertical halo profile below the gate edge acts as a barrier to lateral diffusion of the source/drain dopant. Thus, the channel length can be maintained at the length corresponding to the gate dimension.

The effectiveness of the halo implant in limiting lateral diffusion of the source/drain dopant depends on the halo concentration. However, too high a halo concentration adversely affects channel characteristics. For example, threshold voltage roll-off is distorted and a hot-carrier effect is aggravated. To limit these adverse affects, halo concentration must be limited. Thus, lateral diffusion remains a concern and breakdown voltage unsatisfactorily low. Further control of lateral diffusion of the source/drain dopant is required to enhance the reliability of submicron MOS transistors and to provide for further reductions in device dimensions.

SUMMARY OF THE INVENTION

According to the present invention, a halo implant penetrates transistors gates to a depth below the channel regions. Away from the gates, the same halo implant penetrates to a depth below the sources and drains away from the gates. The resulting halo formation limits lateral diffusion of the source/drain dopants below the channels.

Preliminary steps can involve selection of substrate, field oxide formation, well formation, and channel threshold voltage adjustment. The gate oxide and gate are defined. The halo/punch-through implant and the source drain implants can then be performed; with various orderings possible. For example, a lightly doped source/drain implant can be followed by the high-energy halo/punch-through implant; after sidewall formation, a heavy source/drain implant can be performed. Diffusion follows, with the halo limiting lateral source/drain dopant diffusion.

The resulting structure has a halo of high concentration channel-type dopant for each transistor. This halo extends from under the source, to under the channel to under the drain of the transistor. A channel section of the halo under the channel serves as a lateral stop for the source and drain dopants during diffusion. A source section of the halo is sufficiently below the source that it does not substantially increase the channel-type concentration at the source-well junction at the bottom of the source. A drain section of the halo is sufficiently below the drain that it does not substantially increase the channel-type concentration at the drain-well junction at the bottom of the drain. Accordingly, the source and drain sections of the halo are deeper within the substrate than is the halo channel section.

There are several advantages to this invention. The first advantage is that the advantages of a halo implant are obtained. The halo limits the downward, and more importantly, the lateral diffusion of the source and drain. The second advantage is that depletion width is reduced without compromising the channel threshold voltage. In effect, the halo serves the function of a punch-through implant. The advantages of the conventional halo and the conventional punchthrough are complementary in that the halo is most effective at preventing breakdown when the transistor is on, while punch-through is more effective at preventing breakdown when the transistor is off. The present invention provides the advantages of both the conventional halo implant and the conventional punch-through implant without requiring separate implants.

There are other more subtle and surprising advantages to the invention. Higher halo concentrations can be used without adversely affecting channel characteristics. In the prior art, the halo rises to the substrate surface near the gate edge; at this level it can interfere with channel characteristics. In the present invention, the halo rises only to a level below the channel. Accordingly, the halo of the present invention contributes less to channel voltage roll-off problems and less to the hot-carrier effect. Since adverse affects are minimized, greater halo concentrations can be used. The greater halo concentrations provide higher breakdown voltages, and thus greater device reliability. These and other features and advantages of the present invention are apparent from the description below with reference to the following drawings.

Figure 1:
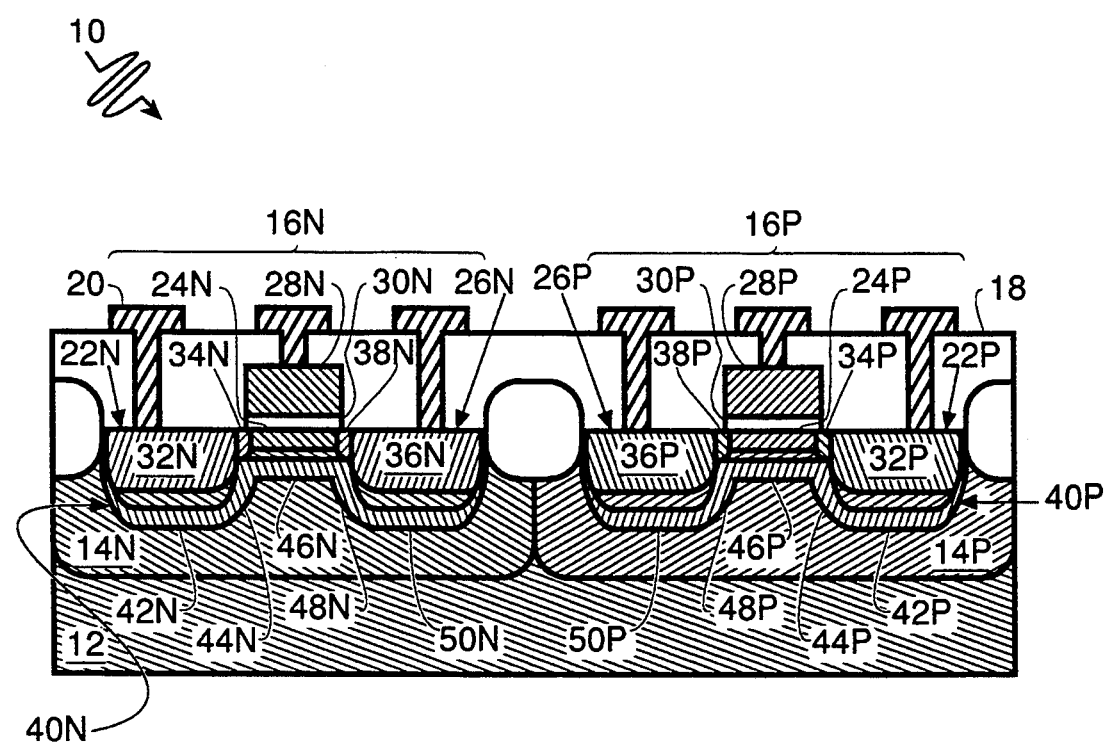
FIGURE 1 is an elevational view of portion of a CMOS integrated circuit in accordance with the present invention.

In the drawings, the hatching of the monocrystalline and polycrystalline silicon roughly indicates doping type and concentration. P-type doping is represented by a positive slope and n-type doping is represented by a negative slope. The steepness of the slope roughly correlates with doping concentration. This convention is applied only to semiconductor materials; hatching of conductive and dielectric materials does not reflect conductivity. Elements of silicon dioxide are not hatched.

DESCRIPTION OF THE PREFERRED EMBODIMENTS

In accordance with the present invention, a CMOS integrated circuit 10 includes a substrate 12, as shown in FIG. 1. Defined within substrate 12 are an n-well 14N and a p-well 14P. Formed within and over n-well 14N is an n-channel transistor 16N. Formed within and over p-well 14P is a p-channel transistor 16P. Formed over both transistors 16N and 16P is a dielectric 18. Contact and via structures 20 provide for electrical connections between transistors 16N and 16P and other transistors of CMOS integrated circuit 10.

N-channel transistor 16N includes a p-type source 22N, an n-type channel 24N, and a p-type drain 26N. Channel 24N is controlled by the voltage applied to gate 28N, from which it is insulated by gate oxide 30N. Source 22N includes a heavily doped source section 32N and a lightly doped source section 34N. Drain 26N includes a heavily doped drain section 36N and a lightly doped drain section 38N. In accordance with the present invention, n-channel transistor 16N includes a heavily doped n-type halo 40N that has a halo source section 42N, a halo source-sidewall section 44N, a halo channel section 46N, a halo drain-sidewall section 48N, and a halo drain section 50N.

Correspondingly, p-channel transistor 16P includes an n-type source 22P, a p-type channel 24P, and an n-type drain 26P. Channel 24P is controlled by the voltage applied to gate 28P, from which it is insulated by gate oxide 30P. Source 22P includes a heavily doped source section 32P and a lightly doped source section 34P. Drain 26P includes a heavily doped drain section 36P and a lightly doped drain section 38P. In accordance with the present invention, p-channel transistor 16P includes a heavily doped p-type halo 40P that has a halo source section 42P, a halo source-sidewall section 44P, a halo channel section 46P, a halo drain-sidewall section 48P, and a halo drain section 50P.

Halo channel section 46N is disposed below channel 24N. The heavy doping of channel section 46N effectively reduces the width of channel 24N, while the doping concentration of channel 24N is at a level selected to provide a desired threshold voltage $V_T=0.7$ volts. Halo channel section 46N thus contributes to an enhanced breakdown voltage for transistor 16N.

Halo source-sidewall section 44N extends from a top level at channel section 46N down to source section 42N. Halo source-sidewall section 44N laterally bounds heavily doped source section 32N, as the top of source-sidewall section 44N is at a lesser depth than the bottom of heavily doped source section 32N. Because of this lateral relationship, halo source-sidewall section 44N acts as a diffusion stop for the source dopant. In this manner, halo source-sidewall section 44N helps maintain a desired source-drain spacing below channel 24N, thus contributing to an enhanced breakdown voltage for transistor 16N.

Halo source-sidewall section 44N differs from prior art halos in that it does not extend up to the level of channel 24N. For this reason, halo 40N does not adversely affect channel threshold voltage roll-off or aggravate the hot-carrier effect. This permits halo 40N to have a relatively high dopant concentration so that it more effectively limits source diffusion, and thus more effectively enhances the breakdown voltage of transistor 16N. Thus, both the presence of halo channel section 46 and the fact that halo 40N remains below channel 24N provide improvements in halo effectiveness.

Halo drain-sidewall section 48N serves a corresponding function relative to heavily doped drain section 36N and provides corresponding advantages. The function that halo 40N serves for transistor 16N is filled by halo 40P for transistor 16P. Hence, the foregoing analysis applies to establish the advantages of halo 40P over prior art halos in enhancing breakdown voltage.

CMOS integrated circuit 10 has a feature size of 0.6 $\mu$m. Substrate 12 is nominally 650 $\mu$m thick. Polysilicon gate is about 0.4 $\mu$m thick. The gate oxide is 0.015 $\mu$m thick.

Wells 14N and 14P are nominally 3 $\mu$m deep. Channels 24N and 24P are 0.1 $\mu$m deep, with a peak at about 0.07 $\mu$m. Halo channel sections 46N and 46P extend from 0.22 $\mu$m down to 0.32 $\mu$m, with a peak at about 0.26 $\mu$m. Lightly doped drain and source sections 32N, 32P, 36N, 36P extend to a depth of about 0.16 $\mu$m.

Far from gates 28N and 28P, heavily doped source and drain sections extend to depths of about 0.25 $\mu$m. Halo source and drain sections 42N, 42P, 50N and 50P extend from a 0.47 m top level to a bottom level of about 0.68 $\mu$m. with a peak concentration at about 0.60 m. While all the boundary figures are dependent on the cutoff selected, they illustrate the effective relationship between the halos and the transistor active regions. Those skilled in the art can recognize that the present invention provides for considerable variation in these dimensions.

Figure 2:
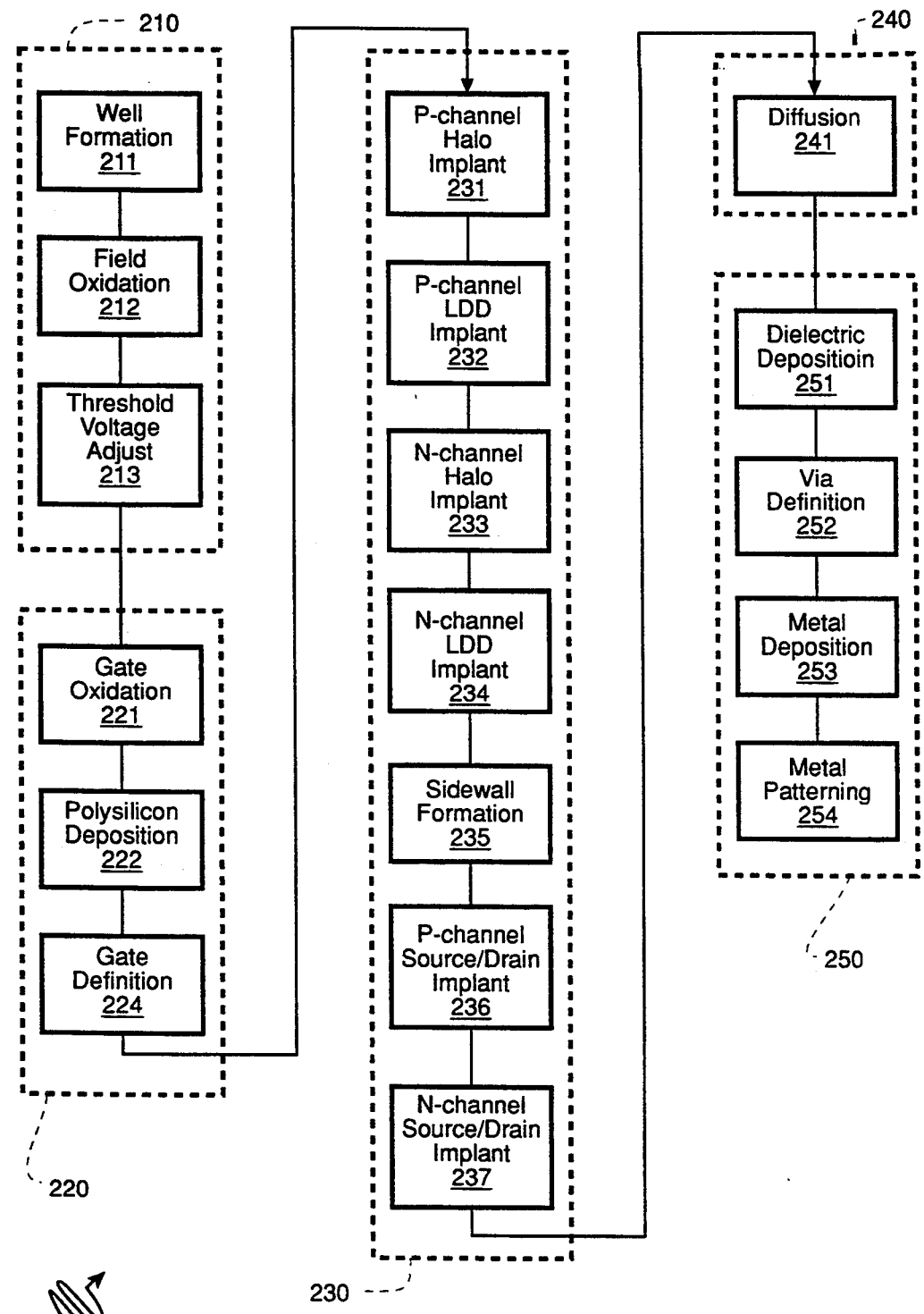
FIG. 2 is a flow chart of a method of fabricating the CMOS integrated circuit of FIG. 1 in accordance with the present invention.

CMOS integrated circuit 10 can be fabricated according a method 200, flow charted in FIG. 2. A group of substrate preparations steps is indicated at stage 210. Well-formation is performed at step 211. This involves making a lightly doped n-type substrate 12 and implanting boron to define p-well 14P. The p-well mask is replaced by a complementary n-well mask. An n-type implement defines n-well 14N with somewhat higher concentration than substrate 12.

Figure 3:
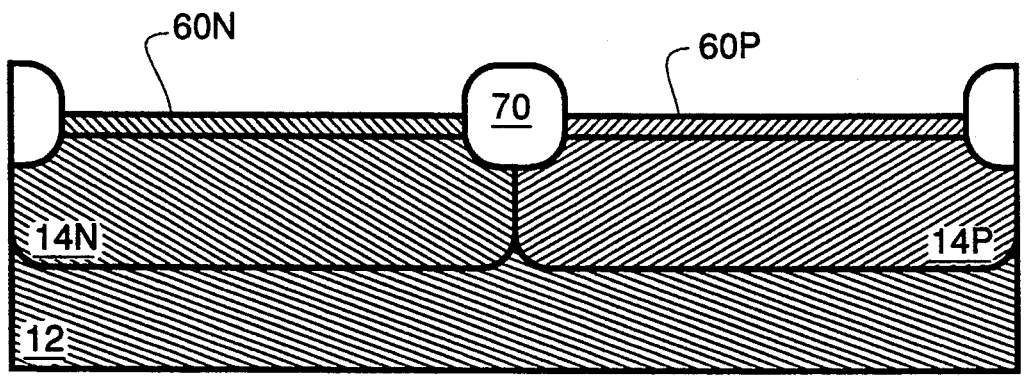
FIGS. 3–7 are elevational views of the transistor of FIG. 1 during steps of the method of FIG. 2.

Field oxide is grown, at step 212, to a thickness of about 0.65 $\mu$m. This involves growing a thin pad silicon dioxide, depositing a layer of silicon nitride, patterning the silicon nitride, and thermally growing the field oxide where silicon is exposed through the nitride mask. The nitride mask is then removed. The resulting field-oxide formation 70 is shown in FIG. 3.

A voltage adjust implant is performed at step 213. Boron is implanted into n-well 14N to define an n-channel implant 60N and into p-well 14P to form a p-channel implant 60P, as shown in FIG. 3. The extra boron in the p-well serves as a reserve for losses during further processing. For both the p-well and the n-well, this boron voltage-adjust implant provides a nominal 0.7 volt turn on for to-be-defined channels 24N and 24P.

Figure 4:
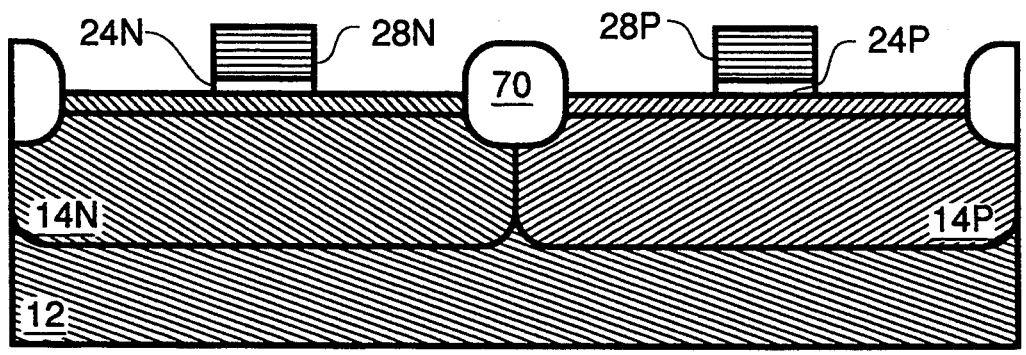

Gates 28N and 28P are formed in stage 220. A gate oxide is grown, at step 221, over the structure of FIG. 3. Polysilicon is deposited, at step 222, over the gate oxide. The resulting structure is photolithographically masked and etched at step 223, resulting in the structure of FIG. 4. As indicated in FIG. 4, gates 28N and 28P are initially undoped.

Source, drain and halo dopants are implanted in stage 230. A pad oxide is grown on the structure of FIG. 4 to protect the surface of substrate 12. The dopant for halo 40P is implanted at step 231. N-well 14N is masked; boron is implanted at very high energy, nominally 65 KeV, into p-well 14P to form p-halo implant 62P, shown in FIG. 5. Phosphorous is implanted at step 232 at moderate concentration and low energy, nominally 25 KeV, to create an n-type lightly doped drain implant 64P. The order of lightly doped drain implant (step 232) and the halo implant (step 231) can be reversed.

Figure 5:
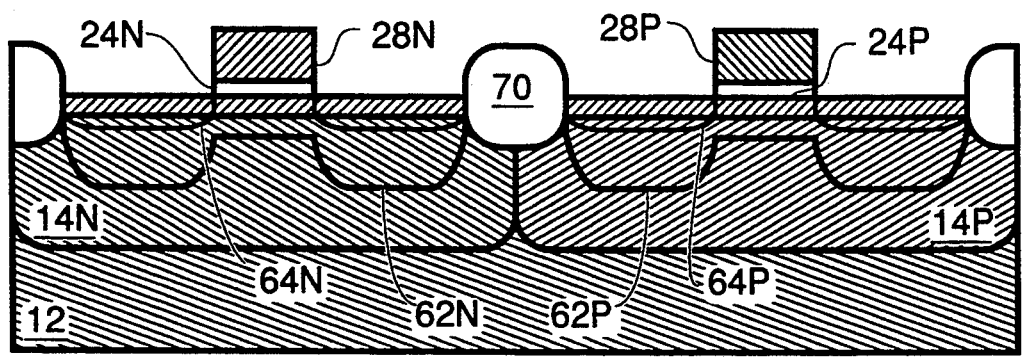

The mask over n-well 14N is removed, and p-well 14P is then masked. Phosphorous is implanted, at step 233, at very high energy, nominally 90 KeV, into n-well 14N to create a high-concentration n-type halo implant 62N. Boron is implanted, at step 234, at low energy, nominally 15 KeV, to provide a p-type lightly doped drain implant 64N in n-well 14N. The resulting structure is shown in FIG. 5. As above, the order of lightly doped drain implant (234) and the halo implant (233) can be reversed. As a result of these halo implants, formerly undoped polysilicon gates 28N and 28P become doped, and thus conductive.

As in the prior art, the energies of the halo implants are sufficient to drive halo dopant to a level below that to be occupied by sources 22N and 22P and by drains 26N and 26P. In contrast with the prior art, the halo implant energies are sufficient to drive dopant through gates 28N and 28P to levels below channel implants 60N and 60P. Prior art halo implant energies would be typically about 35 KeV for the boron p-well halo and about 45 KeV for the phosphorous n-well halo. In other words, the present invention employs halo implant energies approximately twice those used in the prior art. Furthermore, the gate would be capped or thicker to prevent halo dopant from penetrating into the channels.

Figure 6:
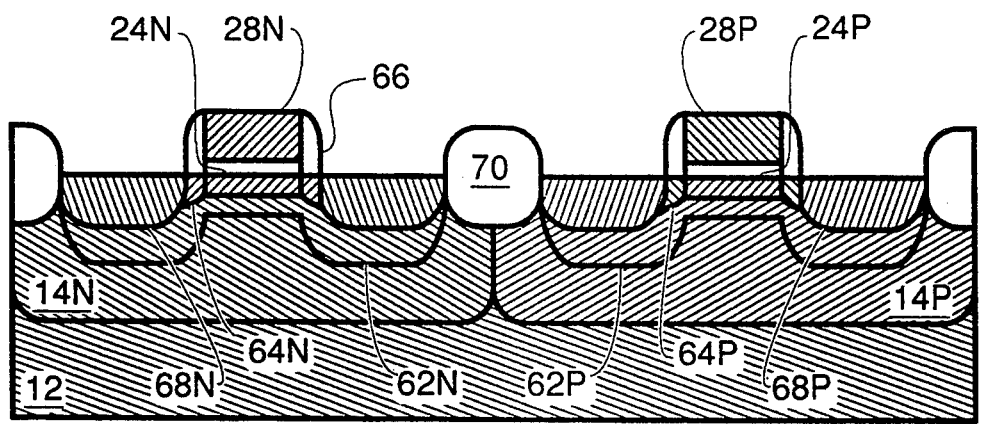
Figure 7:
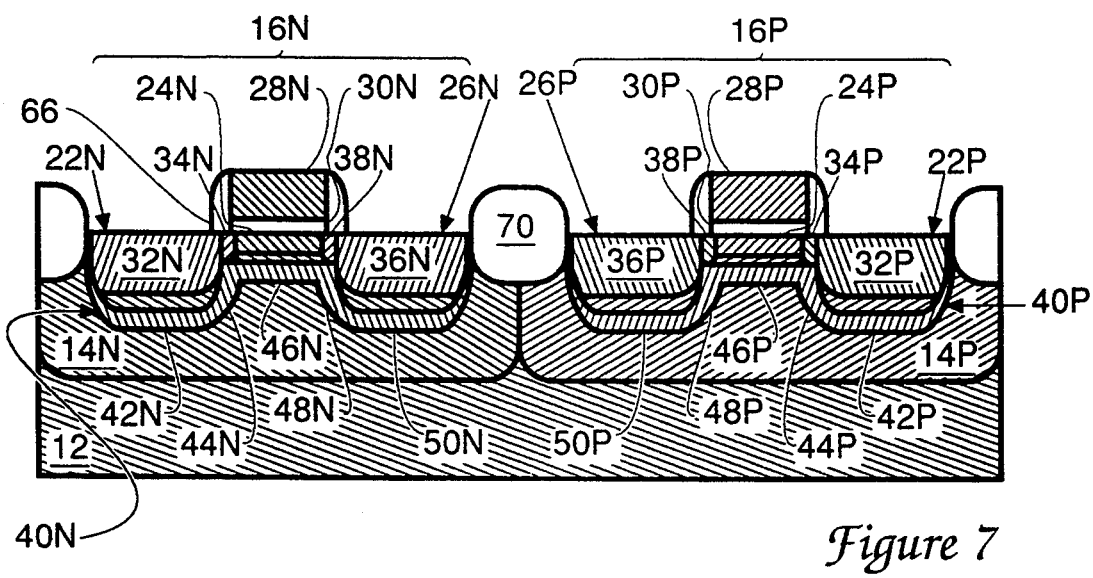

Sidewalls 66, shown in FIG. 6, are formed at step 235. Oxide is grown over the structure of FIG. 5. The oxide growth is directionally (anisotropically) etched leaving sidewalls 66.

Source/drain implant 68N is created at step 236. P-well 14P is masked. A heavy boron implant establishes source/drain implant 68N. The implant energy is such that the source/drain implant 68N are above halo implant 62N.

Source/drain implant 68P is created at step 237. The mask over p-well 14P is removed and n-well 14N is masked. A heavy arsenic implant establishes source/drain implant 68P. The implant energy is such that the source/drain implant 68P is above halo implant 62P. The order of steps 236 and 237 can be reversed.

Stage 240 consists of a single diffusion step 241. Heat is applied for a predetermined time. The dopant in each implant 60N, 60P, 62N, 62P, 5 64N, 64P, 68N, 68P, 70N and 70P diffuses a distance that is positively correlated with time, temperature and original implant concentration, and is negatively correlated with the background concentration. The factors are adjusted so that halo implants 62N and 62P provide the background concentration that inhibits lateral diffusion of source drain implants 68N and 68P, respectively. This diffusion essentially completes the formation of transistors 16N and 16P. The resulting structure is shown in FIG. 6.

Interconnection for transistors 16N and 16P and other transistors of CMOS integrated circuit 10 is established at stage 250. Dielectric layer 18 is deposited at step 251. Vias are defined at step 252. Aluminum is deposited at step 253, filling the vias and forming a metal layer. The metal layer is photolithographically patterned, at step 254, leaving contact and via structures 20. The resulting structure is shown in FIG. 1. (Sidewalls 66 are not separately shown as they merge with dielectric layer 18.)

While the invention has been illustrated with respect to a CMOS integrated circuit, NMOS and PMOS implementations are also provided for. The invention can also be combined with bipolar technology to for BiCMOS circuits. The invention provides for a variety of substrate preparation sequences and contact and interconnect technologies. These and other modifications to and variations upon the preferred embodiments are provided for by the present invention, the scope of which is limited only by the following claims.

We claim:

1. In a method of forming a MOS transistor having a channel of a predetermined channel conductivity type, said channel defining a channel region, said MOS transistor having a source and a drain of a source conductivity type opposite said channel conductivity type, said source defining a source region, said drain defining a drain region, said method comprising the steps of:
    forming a gate;
    implanting a halo dopant of said channel conductivity type with sufficient energy so that the implant species drives through said gate to a first depth below said channel region, said implant species being driven below said source and drain regions to a second depth deeper than said first depth; and
    implanting a source/drain dopant of said source conductivity type into said source and drain region.

2. A method as recited in claim 1 wherein said halo implant is performed before said source/drain implant.

3. A method as recited in claim 1 wherein said source/drain implant is performed before said halo implant.

4. A method as recited in claim 1 further comprising a step of forming oxide sidewalls on said gate;
    said halo dopant being implanted before said sidewalls are formed;
    said source/drain implant being performed in two substeps:
        a lightly doped source/drain substep performed before said sidewalls are formed, and
        a heavily doped source/drain substep performed after said sidewalls are formed.

5. A method of fabricating a CMOS integrated circuit, said CMOS circuit having an n-channel transistor and a p-channel transistor formed in and on a silicon substrate, said n-channel transistor having an n-type gate, a p-type heavily doped source, a p-type lightly doped source, an n-type channel, a p-type lightly doped drain, a p-type heavily doped drain, said p-channel transistor having a p-type gate, an n-type heavily doped source, an n-type lightly doped source, a p-type channel, an n-type lightly doped drain, and an n-type heavily doped drain, said method comprising the steps of:
    a) forming an n-well and a p-well in said silicon substrate;
    b) growing a patterned field oxide to isolate said wells;
    c) implanting p-type dopant to adjust channel voltage thresholds;
    d) growing a gate oxide layer;
    e) depositing a polysilicon layer;
    f) patterning said polysilicon layer and said gate oxide layer to define a first polysilicon gate structure for said n-type gate and a second polysilicon gate structure for said p-type gate;
    g) after step f, implanting p-type halo dopant so that:
        some of said p-type halo dopant is implanted into said silicon substrate after penetrating said second polysilicon gate structure to a level below said p-channel but not completely deeper than said heavily doped n-type source and said heavily doped n-type drain, thus imparting p-type conductivity to define said p-type gate, and
        some of said p-type halo dopant is implanted into said silicon without passing through said second polysilicon gate structure to a depth deeper than said heavily doped n-type source and said heavily doped n-type drain;
    h) after step f, implanting n-type source/drain dopant so as to provide the dopant for said n-type lightly doped drain and said n-type lightly doped source;
    i) after step f, implanting n-type halo dopant so that:
        some of said n-type halo dopant is implanted into said silicon substrate after penetrating said first polysilicon gate structure to a level below said n-channel but not completely deeper than said heavily doped p-type source and said heavily doped p-type drain, thus imparting n-type conductivity to define said n-type gate, and
        some of said n-type halo dopant is implanted into said silicon without passing through said first polysilicon gate structure to a depth deeper than said heavily doped p-type source and said heavily doped p-type drain;
    j) after step f, implanting p-type source/drain dopant so as to provide the dopant for said p-type lightly doped drain and said p-type lightly doped source;
    l) after steps g, h, i, and j, forming oxide sidewalls on said gates;

m) after step 1, implanting p-type source/drain dopant into said substrate to provide the dopant for said heavily doped p-type source and said heavily doped p-type drain;

n) after step 1, implanting n-type source/drain dopant into said substrate to provide the dopant for said heavily doped n-type source and said heavily doped n-type drain;

o) diffusing the dopant implanted in steps g, h, i, j, m and n;

p) depositing a dielectric;

q) forming vias in said dielectric;

r) depositing metal over said dielectric and into said vias; and q) patterning said metal.

* * * * *